(12) United States Patent
Lee et al.

(10) Patent No.: US 7,777,408 B2
(45) Date of Patent: Aug. 17, 2010

(54) ORGANIC LIGHT-EMITTING DEVICE

(75) Inventors: Young-gu Lee, Suwon-si (KR); In-seo Kee, Seongnam-si (KR); In-sung Song, Yongin-si (KR); Euk-che Hwang, Osan-si (KR); Hong-shik Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 297 days.

(21) Appl. No.: 11/868,625

(22) Filed: Oct. 8, 2007

(65) Prior Publication Data
US 2008/0111480 A1 May 15, 2008

(30) Foreign Application Priority Data
Nov. 13, 2006 (KR) .................. 10-2006-0111890

(51) Int. Cl.
*H01J 63/04* (2006.01)
*H01J 1/62* (2006.01)

(52) U.S. Cl. .................. 313/504; 313/506

(58) Field of Classification Search .......... 313/504, 313/506; 428/690; 257/40; 427/66
See application file for complete search history.

(56) References Cited

U.S. PATENT DOCUMENTS

| 4,356,429 | A | 10/1982 | Tang | |
|---|---|---|---|---|
| 6,392,250 | B1 * | 5/2002 | Aziz et al. | 257/40 |
| 6,614,175 | B2 * | 9/2003 | Aziz et al. | 313/504 |
| 6,831,406 | B1 * | 12/2004 | Fukuyama et al. | 313/504 |
| 2002/0086180 | A1 * | 7/2002 | Seo et al. | 428/690 |
| 2002/0121860 | A1 * | 9/2002 | Seo et al. | 313/506 |
| 2005/0191776 | A1 * | 9/2005 | Lamansky et al. | 438/22 |
| 2005/0221121 | A1 * | 10/2005 | Ishihara et al. | 428/690 |
| 2006/0134460 | A1 * | 6/2006 | Kondakova et al. | 428/690 |
| 2006/0251919 | A1 * | 11/2006 | Aziz et al. | 428/690 |
| 2007/0024188 | A1 * | 2/2007 | Kim et al. | 313/504 |
| 2007/0048546 | A1 * | 3/2007 | Ren | 428/690 |
| 2008/0207864 | A1 * | 8/2008 | Nakagawa et al. | 528/25 |

OTHER PUBLICATIONS

"Thermally Stable Multi-layered Organic Electroluminescent Devices Using Novel Starburst Molecules, 4,4',4"-Tri(N-carbazolyl) triphenylamine (TCTA) and 4,4',4"—Tris (3-metholyphenyphenyl-amino)triphenylamine (m-MTDATA), as Hole-Transport Materials", Advanced Material, 6, p. 677 (1994).

"Excitonic singlet-triplet ratio in a semiconducting organic thin film", Baldo, et al., Phys. Rev. B, 1999, 60, 14 422- 14 428.

* cited by examiner

*Primary Examiner*—Peter J Macchiarolo
*Assistant Examiner*—Glenn Zimmerman
(74) *Attorney, Agent, or Firm*—Cantor Colburn LLP

(57) ABSTRACT

Provided is an organic light-emitting device exhibiting lower driving voltages and improved lifetime characteristics and emission efficiency. The organic light-emitting device includes a cathode; an anode; and a light-emitting layer interposed between the cathode and the anode, wherein a buffer layer is disposed on at least one surface of the light-emitting layer.

9 Claims, 2 Drawing Sheets

→ ANODE
→ HOLE INJECTION LAYER
→ HOLE TRANSPORT LAYER
→ FIRST BUFFER LAYER
→ LIGHT-EMITTING LAYER
→ SECOND BUFFER LAYER
→ ELECTRON TRANSPORT LAYER
→ ELECTRON INJECTION LAYER
→ CATHODE

→ ANODE
→ HOLE TRANSPORT LAYER
→ HOLE TRANSPORT LAYER
→ FIRST BUFFER LAYER
→ LIGHT-EMITTING LAYER
→ HOLE BLOCKING LAYER
→ ELECTRON TRANSPORT LAYER
→ ELECTRON INJECTION LAYER
→ CATHODE

ORGANIC LIGHT-EMITTING DEVICE

CROSS-REFERENCE TO RELATED PATENT APPLICATION

This application claims priority from Korean Patent Application No. 10-2006-0111890, filed on Nov. 13, 2006, in the Korean Intellectual Property Office, the disclosure of which is incorporated herein in its entirety by reference.

BACKGROUND OF THE INVENTION

1. Field of the Invention

The present invention relates to an organic light-emitting device, and more particularly, to an organic light-emitting device showing lower driving voltages and improved lifetime and emission efficiency.

2. Description of the Related Art

Organic light-emitting devices are active emission display devices that emit light by recombination of electrons and holes in a thin layer (hereinafter, referred to as "organic layer") formed of a fluorescent or phosphorescent organic compound when a current is applied to the organic layer. Organic light-emitting devices have advantages such as lightness, simple constitutional elements, easy fabrication process, superior image quality, and wide viewing angles. In addition, organic light-emitting devices can achieve high color purity and perfectly create dynamic images, and have electrical properties suitable for use in portable electronic equipment due to low power consumption and low driving voltages.

Generally, organic light-emitting devices have a sequentially stacked structure of an anode, a hole transport layer, a light-emitting layer, an electron transport layer, and a cathode on a substrate. In order to facilitate the injection of electrons and holes, an electron injection layer and a hole injection layer may be further provided.

Materials that can be used to form a light-emitting layer in an organic light-emitting device are divided according to emission mechanisms into fluorescent materials using a singlet exciton and phosphorescent materials using a triplet exciton. A light-emitting layer is formed of a fluorescent or phosphorescent material alone or an appropriate host material doped with the fluorescent or phosphorescent material. Singlet excitons and triplet excitons are formed in a host during electronic excitation. At this time, a statistical ratio of the singlet excitons to the triplet excitons is 1 to 3 [Baldo, et al., Phys. Rev, B, 1999, 60, 14422].

Organic light-emitting devices having the above-described structure are operated as follows. When voltages are applied to an anode and a cathode, holes from the anode are moved to a light-emitting layer via a hole transport layer. On the other hand, electrons from the cathode are moved to the light-emitting layer via an electron transport layer. In the light-emitting layer, the carriers are recombined to generate excitons. By the radiative decay of the excitons, light emission occurs at the wavelength corresponding to the bandgap of a light-emitting material contained in the light-emitting layer.

A hole injection layer, a hole transport layer, a light-emitting layer, an electron injection layer, and an electron transport layer constituting an organic light-emitting device are organic layers formed of organic compounds. Device deterioration occurs mainly at interfaces of the organic layers, and thus, there is room for improvement in conventional organic light-emitting devices.

SUMMARY OF THE INVENTION

The present invention provides an organic light-emitting device exhibiting improved lifetime characteristics and emission efficiency and lower driving voltages, due to having improved interface characteristics.

According to an aspect of the present invention, there is provided An organic light-emitting device including:
an anode;
a hole transport layer;
a light-emitting layer;
an electron transport layer;
a cathode; and
at least one of a first buffer layer interposed between the light-emitting layer and the hole transport layer and a second buffer layer interposed between the light-emitting layer and the electron transport layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
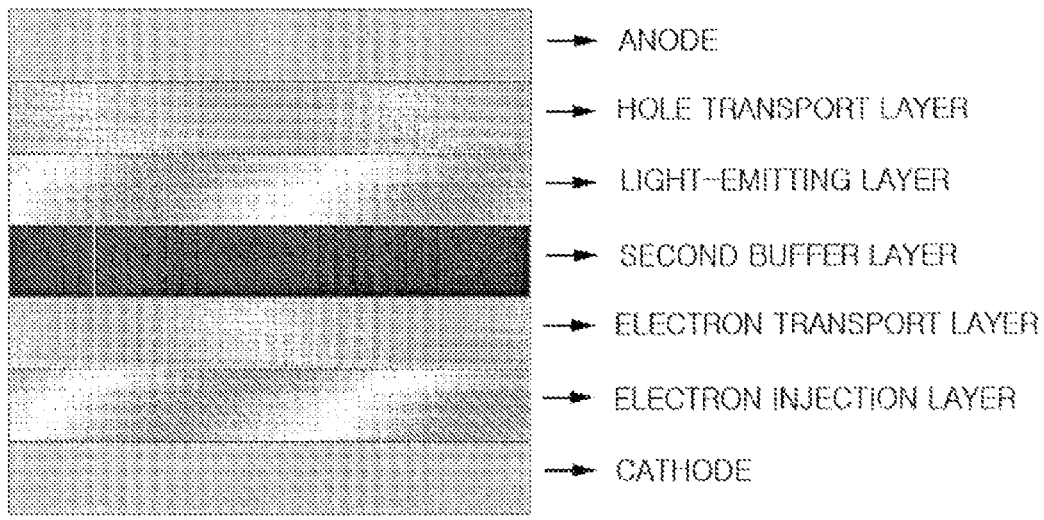
FIGS. 1A through 1C are views illustrating organic light-emitting devices according to embodiments of the present invention.

Hereinafter, the present invention will be described in more detail.

An organic light-emitting device according to the present invention includes an anode, a hole transport layer, a light-emitting layer, an electron transport layer, and a cathode, and a buffer layer is disposed on at least one surface of the light-emitting layer. The buffer layer serves to lower the driving voltage of the device and to enhance the lifetime of the device by adjusting an interface state of the light-emitting layer, and to enhance the emission efficiency of the device by adjusting the component mixture ratio and thickness of the buffer layer.

The organic light-emitting device according to the present invention may further includes an electron injection layer between the cathode and the light-emitting layer and/or a hole injection layer between the anode and the light-emitting layer in order to facilitate the injection and transport of electrons and/or holes.

The buffer layer includes a first buffer layer interposed between the hole transport layer and the light-emitting layer and/or a second buffer layer interposed between the electron transport layer and the light-emitting layer. One of the first buffer layer and the second buffer layer may be disposed on a surface of the light-emitting layer, or alternatively, the first buffer layer and the second buffer layer may be respectively disposed on either surface of the light-emitting layer.

The first buffer layer may be formed as a simple mixture layer or a gradient layer of a hole transport material and a light-emitting material between the hole transport layer and the light-emitting layer. The first buffer layer prevents a rapid change in hole characteristics between the hole transport layer and the light-emitting layer. Thus, the first buffer layer facilitates hole injection from the hole transport layer to the light-emitting layer and functions as a charge balance layer adjusting a balance between holes and electrons.

When the first buffer layer is formed as a gradient layer, the component proportion of the first buffer layer varies in the thickness direction of the first buffer layer. Preferably, the concentration of the light-emitting material in the first buffer layer increases towards the light-emitting layer, and the concentration of the light-emitting material decreases away from the light-emitting layer, i.e., at points closer to the hole transport layer. Similarly, the concentration of the hole transport material in the first buffer layer increases towards the hole transport layer, and the concentration of the hole transport material decreases away from the hole transport layer, i.e., at points closer to the light-emitting layer.

The light-emitting material used to form the first buffer layer is not limited provided that it is a material used to form a light-emitting layer of an organic light-emitting device. For example, the light-emitting material may be tris(8-quinolinolate)aluminum ($Alq_3$), MADN (2-methyl-9,10-di(2-naphthyl)anthracene), 4,4'-N,N'-dicarbazole-biphenyl (CBP), poly(n-vinylcarbazole) (PVK), or the like. These materials may be used alone or in combination with each other at a predetermined ratio. The first buffer layer may further include any of various dopant materials, e.g., a phosphorescent dopant or a fluorescent dopant. Preferably, the fluorescent dopant may be IDE102 and IDE105 (Idemitsu), C545T (Hayashibara), etc. and the phosphorescent dopant may be PtOEP and RD61 (UDC) (red phosphorescent dopant), $Ir(PPy)_3$ (PPy=2-phenylpyridine) (green phosphorescent dopant), F2Irpic (blue phosphorescent dopant), etc. The content of the dopant may be about 0.01 to 15 parts by weight based on 100 parts by weight of the light-emitting material in the first buffer layer.

The hole transport material used to form the first buffer layer is not limited provided that it is a material used to form a hole transport layer of an organic light-emitting device. For example, the hole transport material may be a carbazole-based compound such as N-phenylcarbazole or polyvinylcarbazole; an amine derivative having an aromatic fused ring such as N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD). These materials may be used alone or in combination.

The hole transport material and the light-emitting material in the first buffer layer may be present in a predetermined mixture ratio. The mass ratio of the hole transport material and the light-milting material may be from 1:9 to 9:1, preferably from 3:7 to 7:3.

Unlike the first buffer layer interposed between the light-emitting layer and the hole transport layer, the second buffer layer is interposed between the light-emitting layer and the electron transport layer. As described above, the second buffer layer may be formed regardless of formation of the first buffer layer. The second buffer layer may be formed alone or in combination with the first buffer layer.

Similarly to the first buffer layer, the second buffer layer is formed as a simple mixture layer or a gradient layer between the light-emitting layer and the electron transport layer in order to prevent a rapid change in electron characteristics between the electron transport layer and the light-emitting layer, thereby preventing the degradation of interfacial characteristics of the light-emitting layer, resulting in better lifetime and emission characteristics. Therefore, in particular, the second buffer layer facilitates electron injection from the electron transport layer to the light-emitting layer and functions as a charge balance layer adjusting a balance between holes and electrons.

The second buffer layer is formed as a simple mixture layer or a gradient layer of the light-emitting material and the electron transport material.

Like the first buffer layer, when the second buffer layer is formed as a gradient layer, the proportion of the light-emitting material and the electron transport material in the second buffer layer varies in the thickness direction of the second so buffer layer. Preferably, the concentration of the light-emitting material in the second buffer layer increases towards the light-emitting layer, and the concentration of the light-emitting material decreases away from the light-emitting layer. i.e., at points closer to the electron transport layer. Similarly, the concentration of the electron transport material in the second buffer layer increases towards the electron transport layer, and the concentration of the electron transport material decreases away from the electron transport layer, i.e., at points closer to the light-emitting layer.

The second buffer layer includes the light-emitting material and the electron transport material. The light-emitting material is not limited provided that it is a material used to form a light-emitting layer of an organic light-emitting device, like the light-emitting material used to form the first buffer layer. For example, the light-emitting material may be tris(8-quinolinolate)aluminum ($Alq_3$), MADN (2-methyl-9, 10-di(2-naphthyl)anthracene), 4,4'-N,N'-dicarbazole-biphenyl (CBP), poly(n-vinylcarbazole) (PVK), or the like. These materials may be used alone or in combination with each other at a predetermined ratio. The second buffer layer may further include any of various dopant materials, e.g., a phosphorescent dopant or a fluorescent dopant. Preferably, the fluorescent dopant may be IDE102 and IDE105 (Idemitsu), C45T (Hayashibara), etc., and the phosphorescent dopant may be PtOEP and RD61 (UDC) (red phosphorescent dopant), $Ir(PPy)_3$ (PPy=2-phenylpyridine) (green phosphorescent dopant), F2Irpic (blue phosphorescent dopant), etc. The content of the dopant may be about 0.01 to 15 parts by weight based on 100 parts by weight of the light-emitting material in the second buffer layer.

The electron transport material used to form the second buffer layer is not limited provided that it is a material used to form an electron transport layer of an organic light-emitting device. For example, the electron transport material may be a known material such as a quinoline derivative, in particular, tris(8-quinolinolate)aluminum ($Alq_3$), TAZ, Balq, or Bebq2.

The light-emitting material and the electron transport material in the second buffer layer may be present in a predetermined mixture ratio. The mass ratio of the light-emitting material and the electron transport material in the second buffer layer may be from 1:9 to 9:1, preferably from 3:7 to 7:3.

The thickness of each of the first buffer layer and the second buffer layer can be appropriately selected considering emission efficiency. Preferably, the thickness of each of the first buffer layer and the second buffer layer may range from 50 to 1,000 Å. If thickness of each of the first buffer layer and the second buffer layer is outside the above range, emission efficiency may be lowered or economical advantage(s) may be lowered.

The first buffer layer and the second buffer layer are organic layers and can be formed by an appropriate method known in the art. e.g. deposition, spin coating, casting, inkjet printing or transfer. In particular, when the first buffer layer is formed as a gradient layer, a deposition process is preferred. For this, deposition materials, i.e., a light-emitting layer forming material and a hole transport layer forming material are respectively placed as teed sources on either end of a deposition machine. Then, deposition is performed while moving the machine so that the materials have a concentration gradient. At this time, the deposition conditions may be as, follows: a deposition temperature of 100 to 500° C., a vacuum level of $10^{-8}$ to $10^{-3}$ torr, and a deposition rate of 0.01 to 100 Å/sec.

The above-described buffer layer, i.e., the first buffer layer and the second buffer layer can be applied to an organic light-emitting device. An organic light-emitting device according to the present invention includes a cathode; an anode; and a light-emitting layer interposed between the cathode and the anode, wherein a buffer layer according to the present invention, i.e., the above-described first buffer layer and/or second buffer layer is disposed on at least one surface of the light-emitting layer.

An organic light-emitting device according to the present invention can have very various structures. At least one layer selected from the group consisting of a hole injection layer, a hole blocking layer, an electron blocking layer, and an electron injection layer may be further included among an anode, a hole transport layer, a light-emitting layer, an electron transport layer, and a cathode.

Figure 1B:
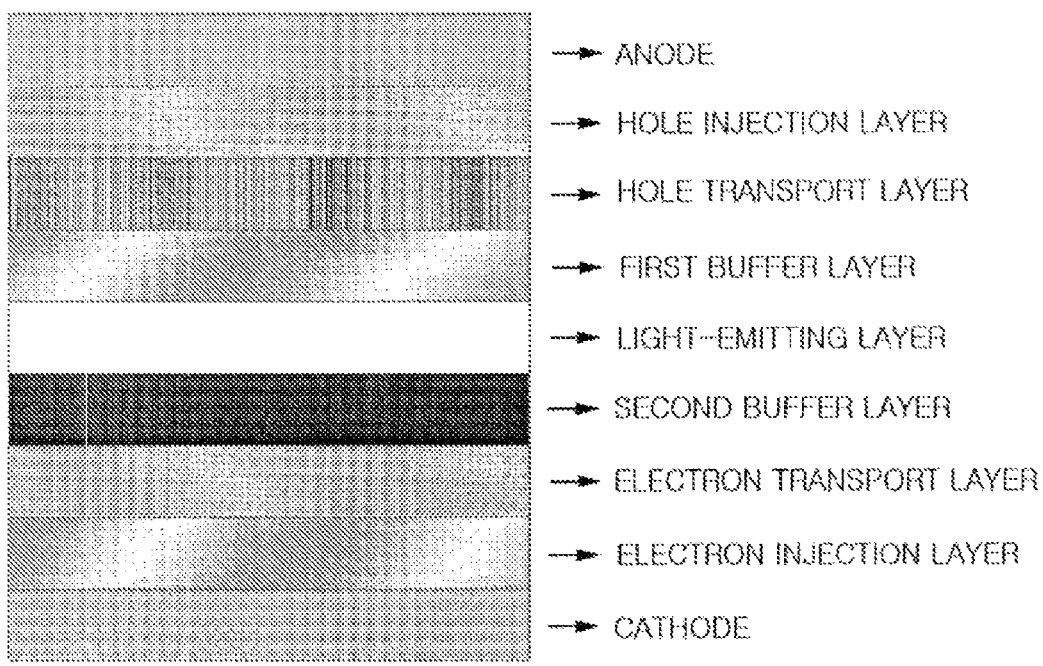
Figure 1C:
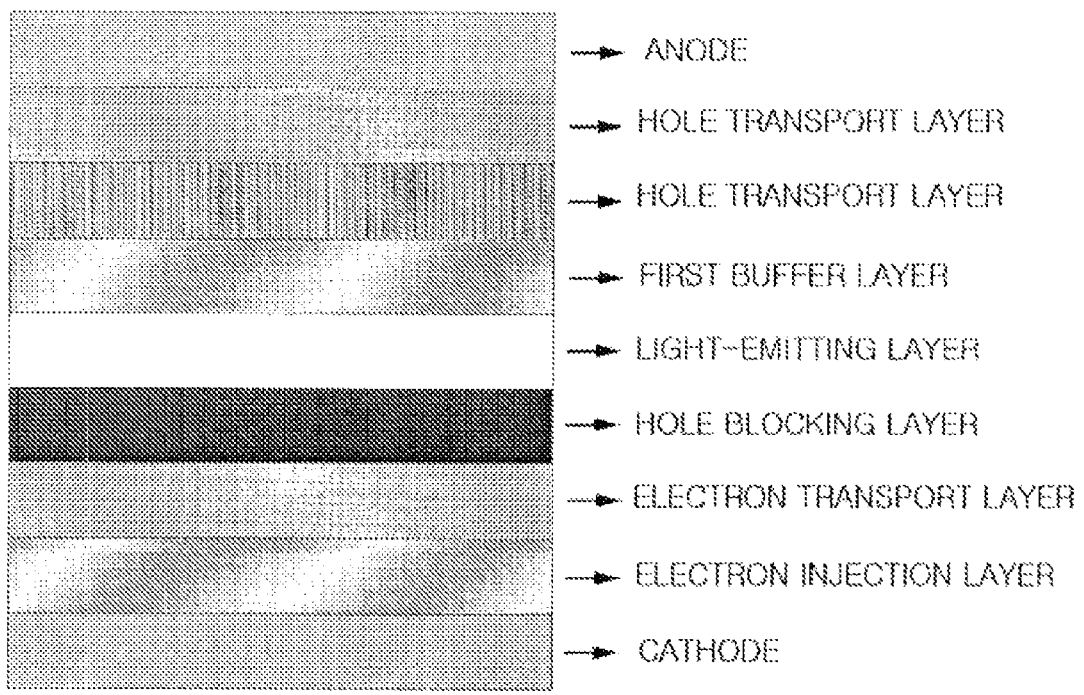

In more detail, organic light-emitting devices according to embodiments of the present invention will be described with reference to FIGS. 1A, 1B, and 1C. Referring to FIG. 1A, an organic light-emitting device has an anode/hole transport layer/light-emitting layer/second buffer layer/electron transport layer/electron injection layer/cathode structure, Referring to FIG. 1B, an organic light-emitting device has an anode/hole injection layer/hole transport layer/first buffer layer/light-emitting layer/second buffer layer/electron transport layer/electron injection layer/cathode structure. Referring to FIG. 1C, an organic light-emitting device has an anode/hole injection layer/hole transport layer/first buffer layer/light-emitting layer/hole blocking layer/electron transport layer/electron injection layer/cathode structure.

A light-emitting layer of an organic light-emitting device according to the present invention may include a red, green, blue, or white phosphorescent or fluorescent dopant. The phosphorescent dopant may be an organometallic compound including at least one element selected from the group consisting of Ir, Pt, Os, Ti, Zr, Hf, Eu, Tb, and Tm.

Hereinafter: a method of manufacturing an organic light-emitting device according to an embodiment of the present invention will be described with reference to FIG. 1.

First, an anode is formed on a substrate by deposition or sputtering using an anode material with a high work function. Here, the substrate may be a substrate commonly used in organic light-emitting devices. Preferably, the substrate may be a glass or transparent plastic substrate which has excellent mechanical strength, thermal stability, transparency, surface smoothness, handling property, and water repellency. The anode material may be a transparent material having good conductivity e.g., indium tin oxide (ITO), indium zinc oxide (IZO), tin oxide ($SnO_2$) or zinc oxide (ZnO).

Next, a hole injection layer (HIL) may be formed on the anode using any one of various methods, such as vacuum deposition, spin-coating, casting, or Langmuir-Blodgett (LB) method.

When forming the hole injection layer using a vacuum deposition process, the deposition conditions vary according to the type of a hole injection layer material, the structure and thermal characteristics of the hole injection layer, etc. However, it is preferred that the hole injection layer should be deposited to a thickness of 10 Å to 5 μm at a deposition rate of 0.01 to 100 Å/sec, at a temperature of 100 to 500° C., in a vacuum level of $10^{-8}$ to $10^{-3}$ torr.

When forming the hole injection layer using a spin-coating process, the coating conditions vary according to the type of a hole injection layer material, the structure and thermal characteristics of the hole injection layer, etc. However, it is preferred that the spin-coating should be performed at a coating speed of about 2,000 to 5,000 rpm, and, after the spin-coating, a thermal treatment should be performed at a temperature of about 80 to 200° C. for the purpose of solvent removal.

The hole injection layer material may be a known hole injection material, e.g., a phthalocyanine compound (e.g., copper phthalocyanine) disclosed in U.S. Pat. No. 4,356,429 a Starburst-type amine derivative (e.g., TCTA, m-MTDATA, or m-MTDAPB) disclosed in *Advanced Material* 6, p. 677 (1994), or a soluble conductive polymer, e.g., polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or polyaniline/poly(4-styrenesulfonate) (PANI/PSS).

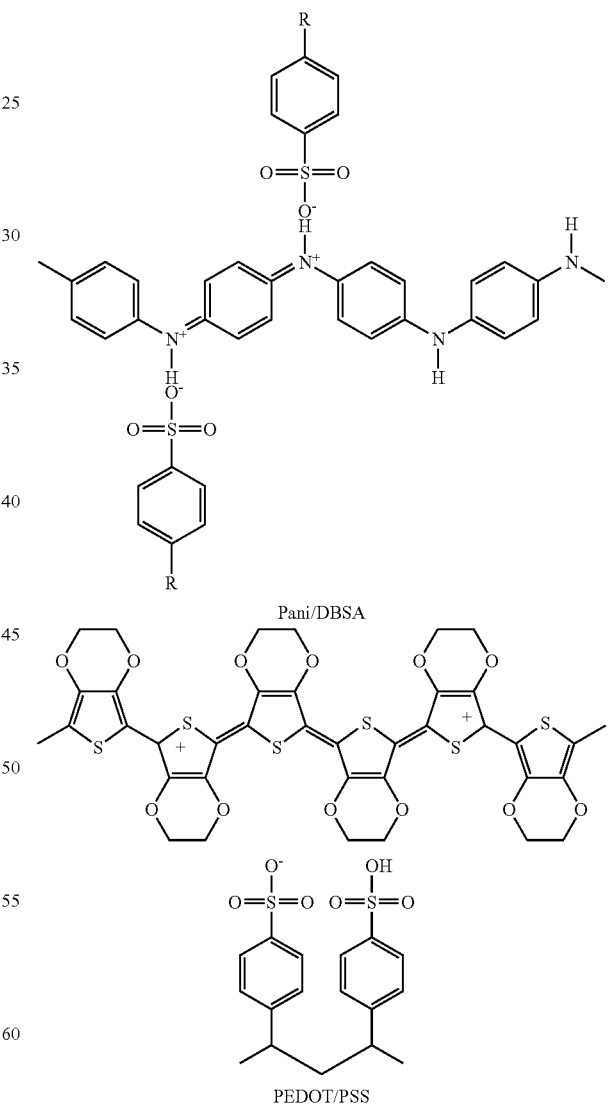

Pani/DBSA

PEDOT/PSS

The thickness of the hole injection layer may be about 100 to 10,000 Å, preferably 100 to 1,000 Å. If the thickness of the hole injection layer is less than 100 Å, hole injection characteristics may be lowered. On the other hand, if the thickness of the hole injection layer exceeds 10,000 Å, a driving voltage may be increased.

Next, a hole transport layer (HTL) may be formed on the hole injection layer using various methods such as vacuum deposition, spin-coating, casting, or LB method. When forming the hole transport layer using vacuum deposition or spin-coating, the deposition or coating conditions vary according to the type of the compound used, but are generally almost the same as those for the formation of the hole injection layer.

The hole transport layer material can be a known hole transport material, e.g., a carbazole derivative such as N-phenylcarbazole or polyvinylcarbazole; an amine derivative having an aromatic fused ring such as N,N'-bis(3-methylphenyl)-N,N'-diphenyl-[1,1-biphenyl]-4,4'-diamine (TPD) or N,N'-di(naphtalene-1-yl-N,N'-diphenylbenzidine ($\alpha$-NPD); etc.

The thickness of the hole transport layer may be about 50 to 1,000 Å, preferably 100 to 600 Å. If the thickness of the hole transport layer is less than 50 Å, hole transport characteristics may be lowered. On the other hand, if the thickness of the hole transport layer exceeds 1,000 Å, a driving voltage may be increased.

Next, a first buffer according to the present invention as described above is formed on the hole transport layer.

Next, a light-emitting layer (EML) may be formed on the first buffer layer using vacuum deposition, spin-coating, casting, or LB method. Haven forming the emitting layer using vacuum deposition or spin-coating, the deposition or coating conditions vary according to the type of the compound used, but are generally almost the same as those for the formation of the hole injection layer.

For the light-emitting layer, a host material may be Alq$_3$, MADN, CBP (4,4'-N,N'-dicarbazole-biphenyl), PVK (poly(n-vinylcarbazole)), or the like. A dopant material may be a fluorescent dopant such as IDE102 and IDE105 (Idemitsu), and C545T (Hayashibara), or a phosphorescent dopant such as a red phosphorescent dopant (PtOEP, RD 61 (UDC)), a green phosphorescent dopant (Ir(PPy)$_3$ (PPy=2-phenylpyridine)), or a blue phosphorescent dopant (F2Irpic).

The doping concentration of the dopant is not particularly limited. Generally, the content of the dopant is 0.01 to 15 parts by weight based on 100 parts by weight of a host.

The thickness of the light-emitting layer may be about 100 to 1,000 Å, preferably 200 to 600 Å. If the thickness of the light-emitting layer is less than 100 Å, emission characteristics may be lowered. On the other hand if the thickness of the light-emitting layer exceeds 1,000 Å, a driving voltage may be increased.

In a case where the light-emitting layer includes a phosphorescent dopant, a hole blocking layer (HBL) may be formed on the light-emitting layer using vacuum deposition, spin-coating, casting, or LB method, in order to prevent the diffusion of triplet excitons or holes into an electron transport layer. When forming the hole blocking layer using vacuum deposition or spin coating, the deposition or coating conditions vary according to the type of the compound used, but are generally almost the same as those for the formation of the hole injection layer. An available hole blocking material may be an oxadiazole derivative, a triazole derivative, a phenanthroline derivative, hole blocking material disclosed in JP 11-329734(A1) or the like.

The thickness of the hole blocking layer may be about 50 to 1,000 Å, preferably 100 to 300 Å. If the thickness of the hole blocking layer is less than 50 Å, hole blocking characteristics may be lowered. On the other hand, if the thickness of the hole blocking layer exceeds 1,000 Å, a driving voltage may be increased.

Next, an electron transport layer (ETL) may be formed using any one of various methods such as vacuum deposition, spin-coating, or casting. When forming the electron transport layer using vacuum deposition or spin-coating, the deposition or coating conditions vary according to the type of the compound used, but are generally almost the same as those for the formation of the hole injection layer. An electron transport layer material serves to stably transport electrons from an electron donor electrode (a cathode) and may be a known material such as a quinoline derivative, in particular, tris(8-quinolinolate)aluminum (Alq$_3$), TAZ, Balq, or Bebq2,

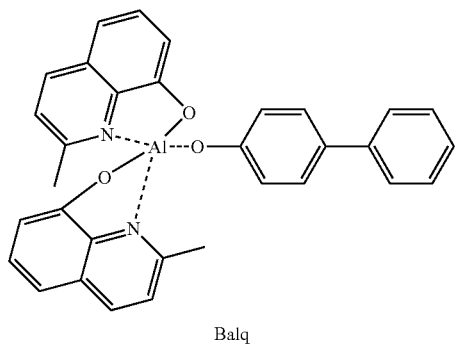

Balq

The thickness of the electron transport layer may be about 100 to 1,000 Å, preferably 200 to 500 Å. If the thickness of the electron transport layer is less than 100 Å, electron transport characteristics may be lowered. On the other hand, if the thickness of the electron transport layer exceeds 1,000 Å, a driving voltage may be increased.

An electron injection layer (EIL) may be formed on the electron transport layer in order to facilitate the injection of electrons from a cathode. An electron injection layer material is not particularly limited. The electron injection layer material may be optionally selected from known materials such as LiF, NaCl, CsF, Li$_2$O, and BaO. The deposition conditions of the electron injection layer vary according to the type of the compound used, but are generally almost the same as those for the formation of the hole injection layer.

The thickness of the electron injection layer may be about 1 to 100 Å, preferably 5 to 50 Å. If the thickness of the electron injection layer is less than 1 Å, electron injection characteristics may be lowered. On the other hand, if the thickness of the electron injection layer exceeds 100 Å, a driving voltage may be increased.

Finally, a cathode may be formed on the electron injection layer using vacuum deposition or sputtering. A material for forming the cathode may be metal or alloy with a low work function, an electroconductive compound, or a mixture thereof. For example, the second electrode material may be lithium (Li), magnesium (Mg), aluminum (Al), aluminum-lithium (Al—Li), calcium (Ca), magnesium-indium (Mg—In), magnesium-silver (Mg—Ag), etc. The cathode may also be a transmissive cathode formed of ITO or IZO to provide a top emission type device.

An organic light-emitting device according to the present invention can have various structures, as well as a structure illustrated in FIG. 1C, i.e., a structure of a first electrode, a hole injection layer (HIL), a hole transport layer (HTL), a light-emitting layer (EML), a hole blocking layer (HBL), an electron transport layer (ETL), an electron injection layer (EIL), and a second electrode.

Hereinafter, the present invention will be described more specifically with reference to the following working examples. However, the following working examples are only for illustrative purposes and are not intended to limit the scope of the invention.

EXAMPLE 1

Organic light-emitting devices having the following structure were manufactured: ITO(1500 Å)/α-NPD(800 Å)/α-NPD+MADN(200 Å)/MADN(400 Å)+2% C545T/Bebq2 (200 Å)/LiF(10 Å)/Al(1500 Å).

A 10 Ω/cm$^2$ (1,500 Å) ITO glass substrate was cut into pieces of 20 mm×20 mm×0.7 mm in size, followed by ultrasonic cleaning in acetone, isopropyl alcohol, and pure water (for 15 minutes each) and then UV/ozone cleaning (30 minutes) to form anodes. α-NPD was thermally deposited on the anodes under a vacuum level of 10$^{-6}$ Torr to form hole transport layers with a thickness of 800 Å. α-NPD and MADN (1:1 by mass) were co-deposited on the hole transport layers to form first buffer layers with a thickness of 200 Å. Then, MADN was vacuum-deposited on the first buffer layers to form light-emitting layers with a thickness of 400 Å. Then, Bebq2 was vacuum-deposited on the light-emitting layers to form electron transport layers with a thickness of 200 Å. LiF (10 Å, electron injection layers) and Al (2000 Å, cathodes) were sequentially vacuum-deposited on the electron transport layers to thereby complete organic light-emitting devices.

EXAMPLE 2

Organic light-emitting devices were manufactured in the same manner as in Example 1 except that first buffer layers were formed to a total thickness of 200 Å by depositing α-NPD and MADN according to the following concentration gradients 4:1, 2:1, 1:1, 1:2, and 1:4 (by mass) (40 Å in thickness for each). In order to form the first buffer layers, α-NPD and MADN were respectively placed on either end of a deposition machine. During rotating substrates on which the hole transport layers were disposed, α-NPD and MADN were deposited while varying the proportion of α-NPD and MADN.

EXAMPLE 3

Organic light-emitting devices were manufactured in the same manner as in Example 1 except that second buffer layers were further formed by co-depositing MADN and Bebq2 (1:1 by mass).

EXAMPLE 4

Organic light-emitting devices were manufactured in the same manner as in Example 2 except that second buffer layers were further formed to a total thickness of 200 Å by depositing MADN and Bebq2 according to the following concentration gradients 4:1, 2:1, 1:1, 1:2, and 1:4 (by mass) (40 Å in thickness for each). The second buffer layers were formed in the same manner as in Example 2.

COMPARATIVE EXAMPLE 1

Organic light-emitting devices were manufactured in the same manner as in Example 1 except that first buffer layers were not formed.

EXPERIMENTAL EXAMPLE

The driving voltage, current density, brightness, electroluminescent (EL) efficiency, and lifetime characteristics of the organic light-emitting devices obtained in Examples 1-4 and Comparative Example 1 were measured, and the results are summarized in Table 1 below.

TABLE 1

| Section | Device characteristics (@1,000 cd/m$^2$) | | | | Lifetime characteristics ($T_{1/2}$) @10,000 cd/m$^2$ |
|---|---|---|---|---|---|
| | Driving voltage (V) | Current density J (mA/cm$^2$) | Brightness (cd/A) | EL efficiency (lm/W) | |
| Comparative Example 1 | 6.0 | 9.9 | 10.1 | 5.29 | 1550 min. |
| Example 1 | 5.5 | 9.0 | 11.1 | 6.34 | 2050 min. |
| Example 2 | 5.7 | 8.5 | 11.7 | 6.45 | 3200 min. |
| Example 3 | 5.6 | 10.3 | 9.75 | 5.47 | 2680 min. |
| Example 4 | 5.9 | 10.1 | 9.92 | 5.28 | 3830 min. |

As can be seen from Table 1 above, the organic light-emitting devices of Examples 1-4 in which a buffer layer was formed on at least one surface of a light-emitting layer had improved lifetime characteristics, driving voltage, current density, and EL efficiency, compared to the organic light-emitting devices of Comparative Example 1.

In an organic light-emitting device according to the present invention a buffer layer is formed on at least one surface of a light-emitting layer. The buffer layer prevents a rapid change in hole characteristics and electron characteristics, thereby preventing device deterioration that may occur at interface(s) between the light-emitting layer and other layer(s), resulting in lower driving voltages and improved emission characteristics and lifetime characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting device comprising: an anode; a hole transport layer; a light-emitting layer; an electron transport layer; a cathode; and at least one of a first buffer layer interposed between the light-emitting layer and the hole transport layer and a second buffer layer interposed between the light-emitting layer and the electron transport layer, wherein the first buffer layer comprises a light-emitting material and a hole transport material, the first buffer layer is formed as a gradient layer of the light emitting material and the hole transport material, and the concentration of the light-emitting material increases towards the light-emitting layer, the concentration of the light-emitting material decreases away from the light-emitting layer, the concentration of the hole transport material increases towards the hole transport layer, and the concentration of the hole transport material decreases away from the hole transport layer; wherein the second buffer layer comprises a light-emitting material and an electron transport material, the second buffer layer is formed as a gradient layer of the light-emitting material and the electron transport material and the concentration of the light-emitting material increases towards the light-emitting layer, the concentration of the light-emitting material decreases away from the light-emitting layer, the concentration of the electron transport material increases towards the electron transport layer, and the concentration of the electron transport material decreases away from the electron transport layer, wherein a mass ratio of the light-emitting material to the hole transport material in the first buffer layer is from 1:9 to 9:1 edge to edge.

2. The organic light-emitting device of claim 1, wherein the light-emitting material of the first buffer layer is at least one selected from the group consisting of $Alq_3$, MADN (2-methyl-9,10-di(2-naphthyl)anthracene), CBP (4,4'-N,N'-dicarbazole-biphenyl), and PVK (poly(n-vinylcarbazole)).

3. The organic light-emitting device of claim 1, wherein the hole transport material of the first buffer layer is at least one selected from the group consisting of N-phenylcarbazole, polyvinylcarbazole, N,N'-bis(3-methylphenyl)-N,N'-diphenyl-[1,1-bipheny]-4,4'-diamine (TPD), and N,N'-di(naphthalene-1-yl)-N,N'-diphenyl benzidine ($\alpha$-NPD).

4. The organic light-emitting device of claim 1, wherein the electron transport material of the second buffer layer is at least one selected from the group consisting of tris(8-quinolinolate)aluminum ($Alq_3$), TAZ, Balq, and Bebq2.

5. The organic light-emitting device of claim 1, wherein a mass ratio of the light-emitting material and the electron transport material in the second buffer layer is from 1:9 to 9:1.

6. The organic light-emitting device of claim 1, wherein the light-emitting material of the first buffer layer or the light-emitting material of the second buffer layer is at least one selected from the group consisting of $Alq_3$, MADN (2-methyl-9,10-di(2-naphthyl)anthracene), CBP (4,4'-N,N'-dicarbazole-biphenyl), and PVK (poly(n-vinylcarbazole)).

7. The organic light-emitting device of claim 1, wherein each of the first buffer layer and the second buffer layer has a thickness of 50 to 1,000 Å.

8. The organic light-emitting device of claim 1, wherein each of the first buffer layer and the second buffer layer is formed by deposition, spin coating, casting, inkjet printing or transfer.

9. The organic light-emitting device of claim 1, wherein the light-emitting layer is a red light-emitting layer, a blue light-emitting layer, a green light-emitting layer, or a white light-emitting layer.

* * * * *